(12) United States Patent  
Narwal et al.

(10) Patent No.: US 7,999,573 B2  
(45) Date of Patent: Aug. 16, 2011

(54) LOW-VOLTAGE-TO-HIGH-VOLTAGE LEVEL CONVERTER FOR DIGITAL SIGNALS AND RELATED INTEGRATED CIRCUIT, SYSTEM, AND METHOD

(75) Inventors: Rajesh Narwal, Karnal (IN); Manoj Kumar, New Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 11/649,746

(22) Filed: Jan. 3, 2007

(65) Prior Publication Data

US 2007/0188193 A1    Aug. 16, 2007

(30) Foreign Application Priority Data

Dec. 30, 2005    (IN) .............................. 3539/DEL/2005

(51) Int. Cl.  
*H03K 19/094* (2006.01)

(52) U.S. Cl. ................ 326/68; 326/81; 326/83; 326/86; 327/108; 327/109

(58) Field of Classification Search .............. 326/62–63, 326/68, 81–83, 86–87; 327/333, 108–109  
See application file for complete search history.

(56) References Cited

U.S. PATENT DOCUMENTS

| | | | |
|---|---|---|---|
| 5,422,523 A | 6/1995 | Roberts et al. | |
| 5,469,080 A * | 11/1995 | Son | 326/81 |
| 6,268,744 B1 * | 7/2001 | Drapkin et al. | 326/81 |
| 6,480,050 B1 * | 11/2002 | Barnes | 327/333 |
| 6,483,766 B2 * | 11/2002 | Lee | 365/230.06 |
| 6,903,576 B2 | 6/2005 | Narwal | |
| 7,034,573 B1 * | 4/2006 | Chang | 326/68 |
| 7,205,819 B2 * | 4/2007 | Davis | 327/333 |
| 7,295,038 B2 * | 11/2007 | Seo | 326/81 |
| 7,432,740 B2 * | 10/2008 | Kanzaki | 326/68 |
| 2005/0162209 A1 | 7/2005 | Dubey et al. | |

* cited by examiner

*Primary Examiner* — James H. Cho  
*Assistant Examiner* — Christopher Lo  
(74) *Attorney, Agent, or Firm* — Lisa K. Jorgenson; Bryan A. Santarelli

(57) ABSTRACT

An embodiment of a low-to-high-level voltage translator is proposed. This translator translates the low voltage swing signals for the core into high voltage swing signals of the I/O blocks. This translator may be particularly useful for high-speed application where the difference between the core and the I/O supply voltage is very large, e.g., the core is working at 0.8V and the I/O is working at 3.6V or higher without little or no static power dissipation. The proposed translator may give improved transition times and propagation delays as compared to conventional translators. The proposed translator may also use less hardware in comparison to other such translators.

36 Claims, 9 Drawing Sheets

LOW-VOLTAGE-TO-HIGH-VOLTAGE LEVEL CONVERTER FOR DIGITAL SIGNALS AND RELATED INTEGRATED CIRCUIT, SYSTEM, AND METHOD

PRIORITY CLAIM

This application claims priority from Indian patent application No. 3539/Del/2005, filed Dec. 30, 2005, which is incorporated herein by reference.

TECHNICAL FIELD

An embodiment of the invention relates to a low-voltage-to-high-voltage-level converter for digital signals and an integrated circuit comprising the same.

BACKGROUND

Advancements in semiconductor fabrication and manufacturing techniques have led to reduction in operating voltage levels. One of the main reasons for using lower operating voltage levels is to reduce the power consumption in semiconductor chips.

But in cases where a chip is interfaced with a bus operator according to a standard based on higher voltage levels, typically only the main bulk (core) of the chip is operated at a lower voltage level and its I/O interface is operated at higher voltage levels. In order to implement such a scheme, the chip translates high-voltage I/O signals to low-voltage core signals and low-voltage core signals to high-voltage I/O signals. A problem while translating low-voltage core signals to high-voltage I/O signals is of D.C. current. If a low-voltage signal is used to drive a device operating at higher voltage, it may cause the device to draw D.C. power, since it is neither fully off nor fully on.

Thus circuitry for translating voltage signals which can minimize D.C. current problems may be used. Also in this present technology, the core is typically manufactured at nanometer technology, which operates at approximately 1.0V. However, most I/O blocks are still operating at 3.3V. So to interface between the I/O blocks and the core a voltage translator that can operate with minimum power dissipation is typically used. Also, often high-speed I/O standards such as LVDS, HSTL etc. are supported to operate at clock speeds of 250 MHz or more and hence voltage translators must satisfy such high frequency requirements in these situations. FIG. 1 shows one such conventionally used translating circuitry. In this circuit, cross-coupled gates use regenerative feedback to quickly pull the output signal to full voltage.

A detailed description of the prior art circuitry shown in FIG. 1 is in U.S. Pat. No. 5,422,523, which is incorporated by reference. The circuitry of FIG. 1 is the embodiment shown in FIG. 6 of the referred patent. The output of inverter LV, working at low voltage (VDDL), is connected to the gate of NMOS 103. Consider the case when IN goes from 0 volts to VDDL, where VDDL is the core voltage which is to be converted to VDDH (I/O Voltage), NMOS 104 is ON which reduces the voltage at line 206. This makes PMOS 101 ON and the voltage at OUT is increased. The output of LV is 0 volts which makes NMOS 103 OFF. An increase in the voltage at OUT makes PMOS 102 less conducting, which further decreases voltage at 206. This cycle is repeated until the voltage at OUT rises to VDDH.

Similarly, when IN goes from VDDL to 0 volts, NMOS 104 goes OFF and NMOS 103 becomes ON, to pull down OUT. Reduction in voltage at OUT makes PMOS 102 slightly ON which in turn increases voltage at line 206. This decreases the conductivity of PMOS 101 leading to further reduction in voltage at OUT. This recursive feedback ultimately makes OUT equal to 0 volts.

This translator circuitry gives good results when the voltage difference between VDDH and VDDL is small, but starts malfunctioning and even fails completely when the difference between higher and lower supply voltages is large. For example FIG. 2 shows the simulation results of the prior art circuitry, for higher supply voltage VCC equal to 3.6V and lower supply voltage equal to 0.8V. In the figure output OUT of translating circuitry is shown for five different operating conditions (mentioned in FIG. 2 itself).

It can be seen that for case.1 (typical process corners), case.3 (fast process corners) and case.5 (nmos fast, pmos slow process corners) the output is acceptable but for case.4 (nmos slow and pos fast process corner) it gets distorted and for case.2 (both nmos and pmos slow process corners) there is no output (constant low).

A reason theorized for the failure of the circuit is the cross-coupled gates using regenerative feedbacks. In this circuit of FIG. 1, switching is initialized by the input signal IN and finally controlled and concluded by regenerative feedback. Switching initialization by the input IN typically has to endure long enough to ensure some threshold voltage reached at the nodes OUT and Net 206, before switching is handed over to regenerative feedback. If the initialization process is weak, then the translator may switch late or will not switch and the output 'OUT' will get distorted or stuck to one state (high or low).

The transition times and rise-rise and fall-fall delays may become worse when the difference between lower and higher supply is large say 0.8V to 3.6V. The situation of having a large difference between higher and lower supply voltages frequently arises in case of FPGAs because FPGAs are frequently used for various applications and are therefore interfaced with various devices operating at varied bus standards. Due to vast and diverse field of applications of FPGAs, it is often desirable to have their I/O interface circuits capable of being programmed to operate at various voltage levels. Here I/O operating voltage levels may range from 3.6V to 1.1V. On the other hand the main bulk (core) operating voltage can be as low as 0.8 V.

To overcome these problems, US 2005/0162209 A1, which is incorporated by reference, describes a high-speed voltage translator shown in FIG. 3. However, the described translator may result in static power dissipation as all devices in the serial path of components 36, 42, 70 and 66, or the serial path of components 40, 44, 54 and 68 may be ON under certain conditions, resulting static power loss. Also the translator uses many PMOS devices, resulting in a larger silicon area.

In reference to the above problems, there is a need for a voltage translator that can translate a low core voltage (as low as 0.8V or lower) to a higher I/O voltage (from 1.V to 3.6V or higher) with improved transition times and delays and with reduced dissipation of static power.

SUMMARY

An embodiment of the invention is a low-voltage to high-voltage level translator.

Another embodiment of the invention is a voltage translator circuit that does not require feedback.

Yet another embodiment of the invention is a voltage translator that provides rapid translation of signals from low to high voltage levels.

An embodiment of the invention is a low-voltage-to-high-voltage level translator comprising:

a first switching element having its control input connected to an input signal and its input terminal connected to a common terminal of a power supply, a low-voltage inverting element having its input connected to the input signal, a second switching element having its control input connected to the output of said low-voltage inverting element and its input terminal connected to the common terminal of the power supply, a complementary switching element having its output connected to the output of said second switching element and its input terminal connected to a high-voltage power supply, a complementary biasing element having its input connected to the high-voltage power supply and its output connected to the control terminal of said complementary switching element, a first high-voltage inverting element having its input connected to the output of said second switching element, a second high-voltage switching element having its input connected to the output of said first high-voltage switching element and its output available as the final output, and a third switching element having its control terminal connected to the output of said first high-voltage inverting element, its input connected to the output of said first switching element and its output connected to the output of said complementary biasing element.

Further, another embodiment of the invention is a low-voltage-to-high-voltage-level translator comprising:

a first switching element having its control input connected to an input signal, a low-voltage inverting element having its input connected to the input signal, a second switching element having its control input connected to the output of said low-voltage inverting element and its input terminal connected to a common terminal of a power supply, a complementary switching element having its output connected to the output of said second switching element and its input terminal connected to a high-voltage power supply, a complementary biasing element having its input connected to the high-voltage power supply and its output connected to the control terminal of said complementary switching element and the output of said first switching element, a first high-voltage inverting element having its input connected to the output of said second switching element, a second high-voltage switching element having its input connected to the output of said first high-voltage switching element and its output available as the final output, and a third switching element having its control terminal connected to the output of said first high-voltage inverting element, its input connected to the common terminal of the power supply and its output connected to the input of said first switching element.

In a related embodiment, a second complementary switching element is provided having its control terminal connected to the output of said first high-voltage inverting element, its output connected to the output of said second switching element and its input terminal connected to the high-voltage power supply.

An embodiment of the present invention is a low-to-high-level-voltage translator that translates the low voltage of the core into a high voltage of the I/O blocks. This translator is useful where the difference between the core and I/O supply voltages is very high, e.g., the core is working at 0.8V and the I/O block is working at 3.6V or higher. Unlike the prior art, the translating circuitry according to an embodiment of the invention does not use cross-coupled gates using regenerative feedback for translating voltages, and it does not have static current problems.

An embodiment of the present invention also provides improved transition times and delays and can also operate at high frequencies.

A single proposed circuit with proper sizing can be used for translating 0.8V to 1.2V, 0.8V to 1.5V, 0.8V to 1.8V, 0.8V to 2.5V, or 0.8V to 3.6V or higher according to an embodiment of the invention.

The same circuit can also provide in-between voltage translation such as from 1.8V to 3.3V, from 1.5V to 2.5V, etc. according to an embodiment of the invention Since an embodiment of the proposed circuit does not need feedback during transition, the hardware used in the circuit (total size of PMOS and NMOS) may be less as compared to the prior art.

DETAILED DESCRIPTION

Figure 1:
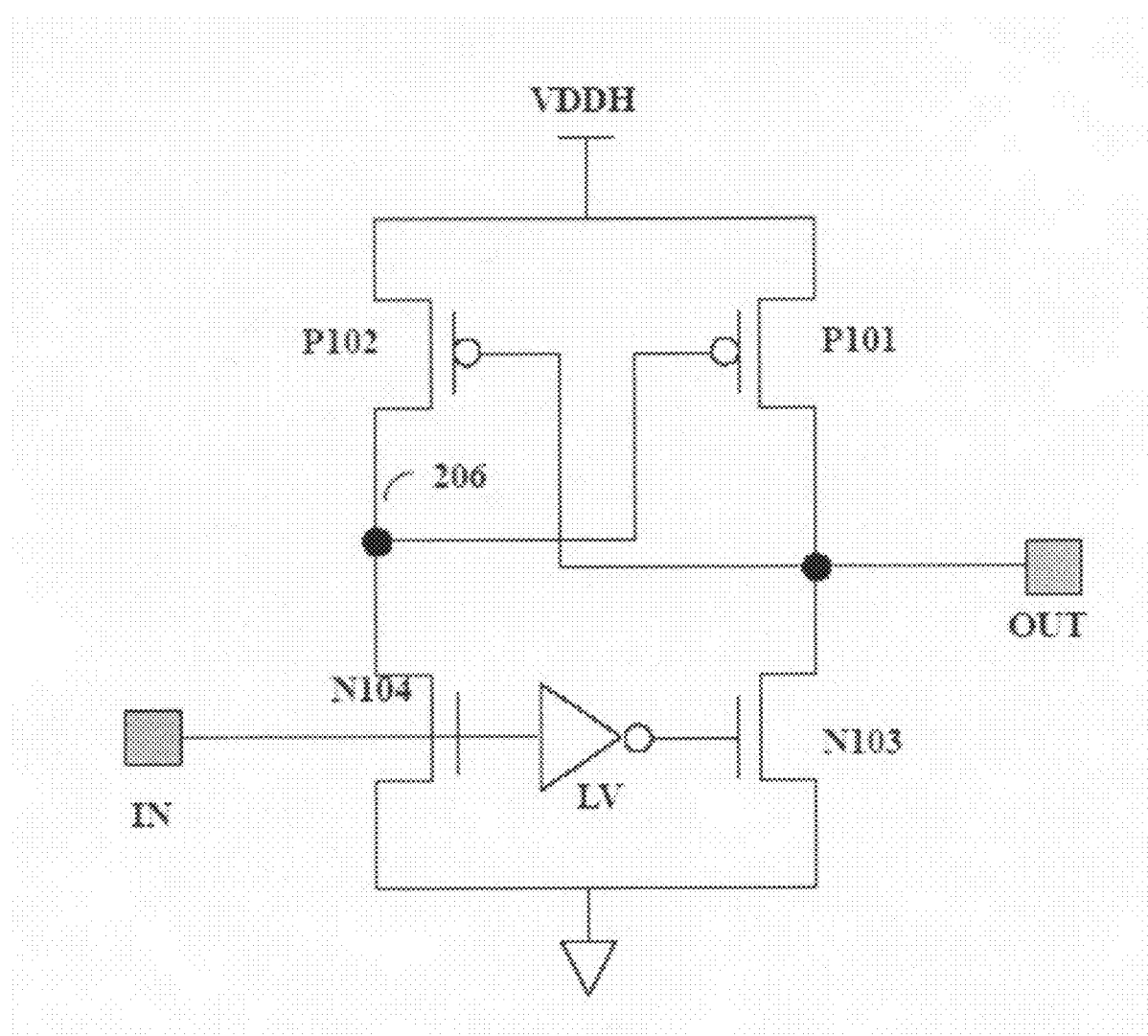
FIG. 1 is a schematic diagram of a prior-art voltage-level converter.
Figure 2:
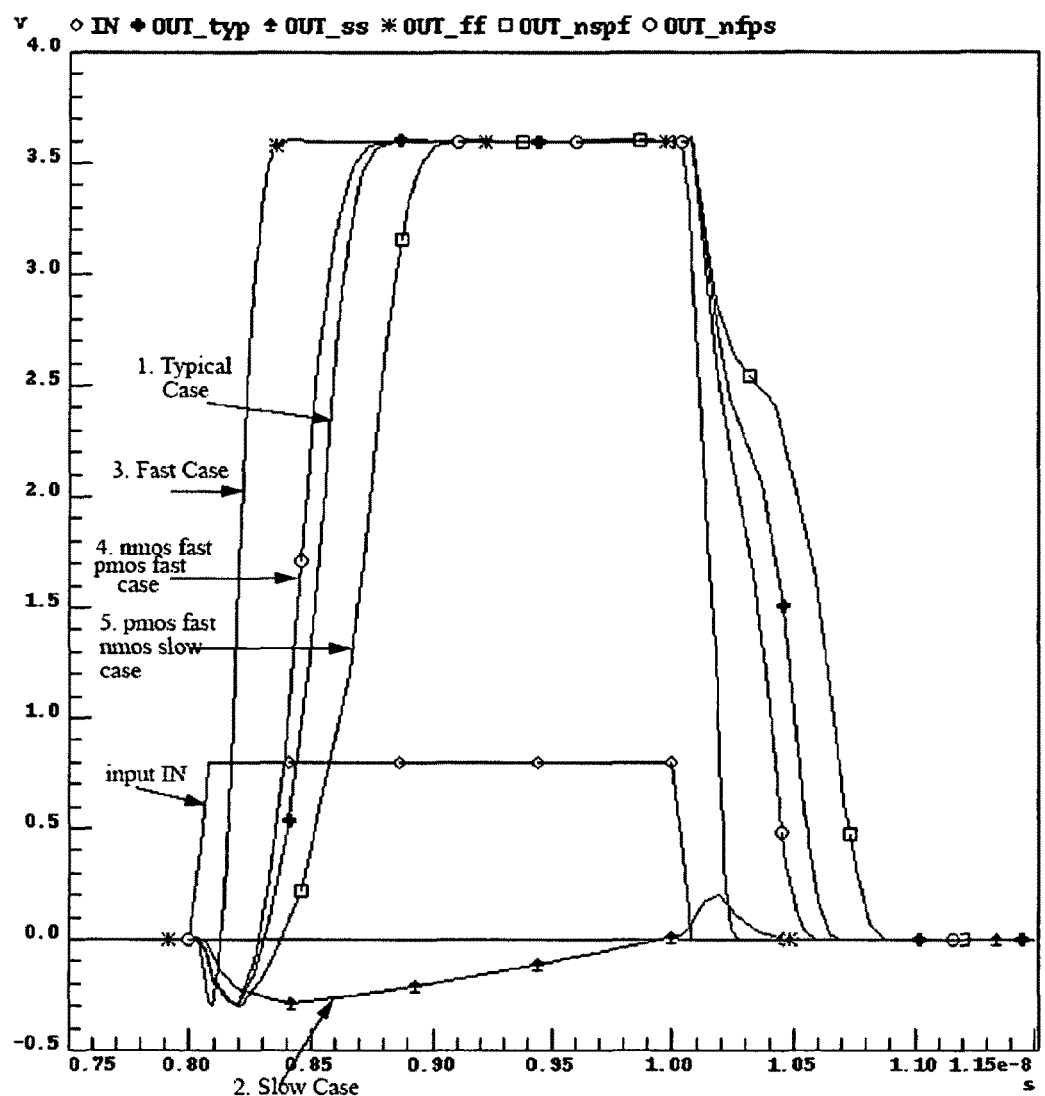
FIG. 2 is a plot of the simulation results of the prior-art circuit of FIG. 1 under different operating conditions for voltage translation of 0.8V to 3.6V.
Figure 3:
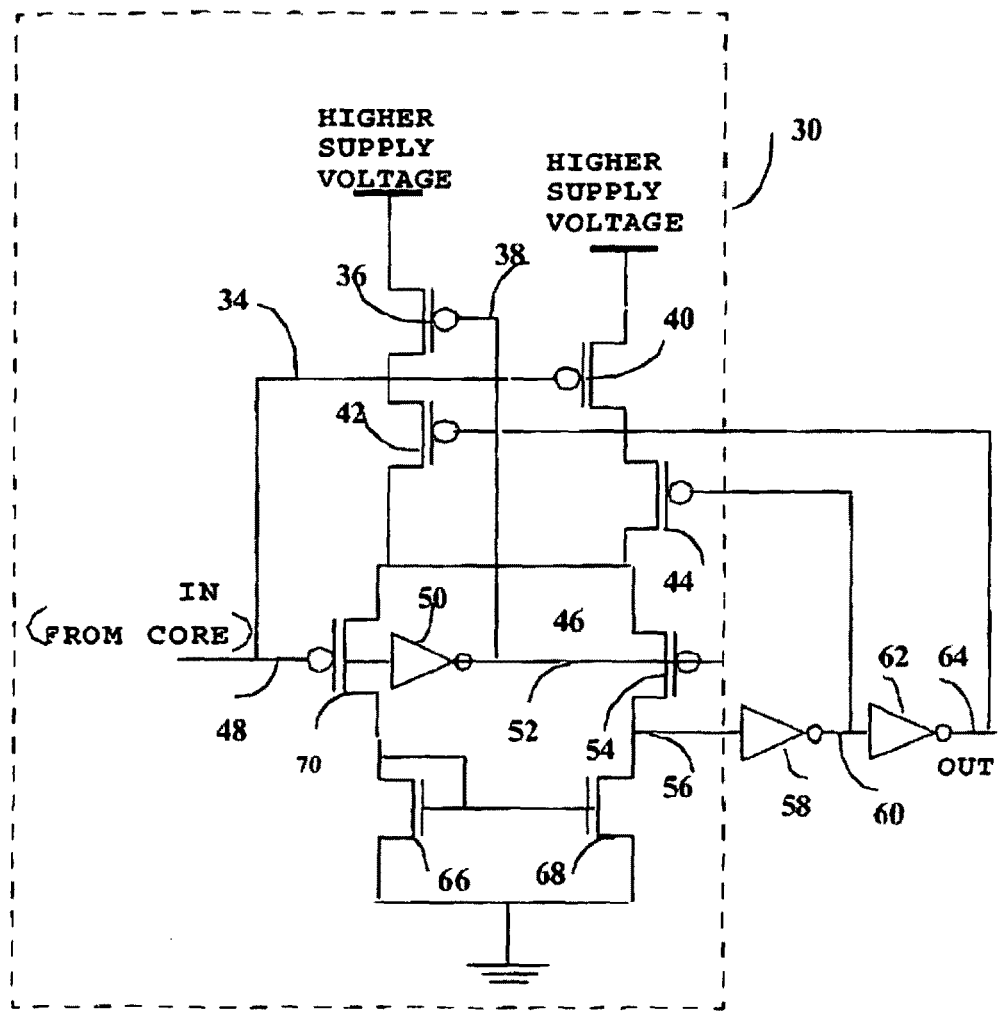
FIG. 3 is a schematic diagram of another prior-art voltage-level translator.
Figure 4:
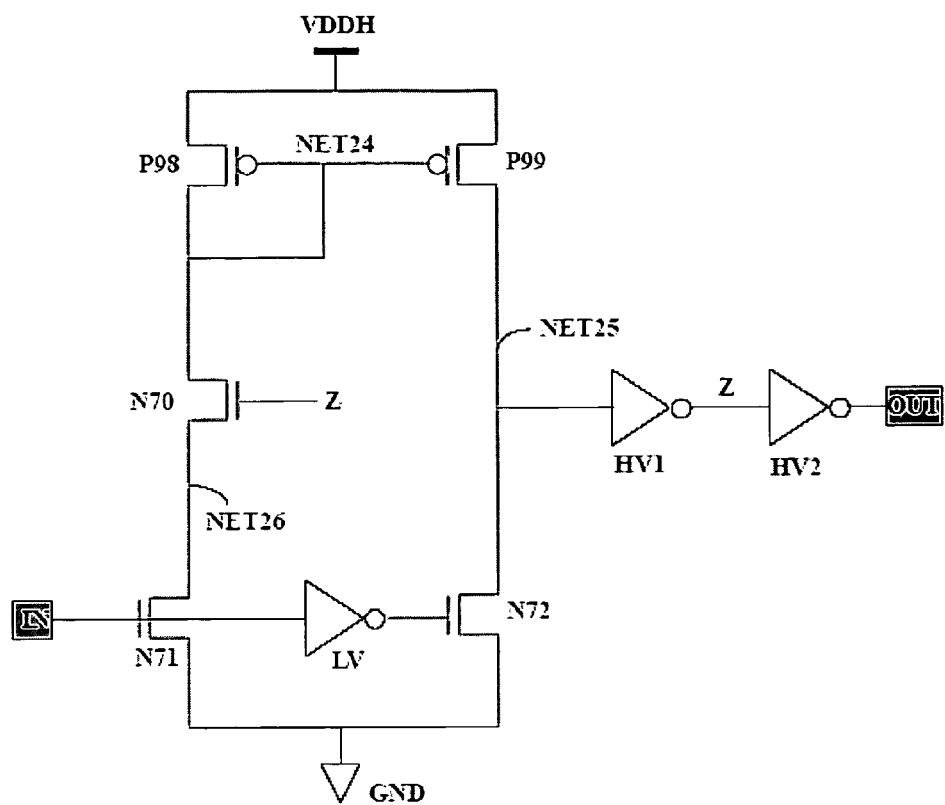
FIG. 4 is a schematic diagram of a voltage-level converter in accordance with an embodiment of the present invention.

An embodiment of a proposed circuit shown in FIG. 4 comprises PMOS transistors P98 and P99. The circuit also comprises NMOSs transistors N70, N71, and N72 and three inverters, LV working at the lower power supply, and HV1 and HV2 working at the higher supply VDDH. The gate and the drain of P98 are connected to NET24. The source of P98 is connected to VDDH. The drain and source of P99 are connected to NET25 and VDDH respectively. The gate of P99 is connected to NET24. The gate of N70 is connected to Z and the source and drain of N70 are connected to NET26 and NET24 respectively. The gate of N71 is connected to IN and the source and drain of N71 are connected to GND and NET26 respectively. The input of LV is also connected to IN and the output of LV is connected to the gate of N72. The source and drain of N72 are connected to GND and NET25 respectively. The input and output of HV1 are connected to NET25 and Z respectively. The input and output of HV2 are connected to Z and OUT respectively.

Operation of the proposed circuit is to translate the lower-voltage logic level to the corresponding higher-voltage logic level. The proposed circuit can be easily understood by considering an example. Considering that circuit is to translate a signal of 1V to 3.3V. First of all considering IN=0V and OUT=0V. At this point N71 is OFF as its gate is connected to IN and as OUT=0V, node Z is at 3.3V. This makes N70 ON and the voltage at NET24 is VDDH-VT(P98), where VT(P98) is the threshold voltage of P98. This weakly turns ON P99. The output of inverter LV is 1V as its input is connected to IN (0V). This makes N72 ON and as N72 is completely ON and P99 is weakly ON, NET25 is pulled down to logic low. The size of P99 is small, therefore as N72 becomes ON and NET25 is pulled down to logic LOW. The trip point of HV1 is adjusted at the center point of the swing at NET25. This keeps rise and fall delays equal. and similarly the trip point of HV2 is at 0.5*VDDH.

Now considering the case where input switches from 0v to 1V, N71 is turned ON and N72 is turned OFF. As N71 becomes ON and also N70 is conducting, both N70 and N71 pull down NET24. This makes P99 more strongly ON (earlier Vsg of P99 was only VT(P98)) and also the gate voltage of N72 is 0V. This turns N72 OFF and P99 pulls up NET25. As the voltage at NET25 crosses the trip point of HV1, voltage at Z becomes 0V and makes OUT 3.3V. As Z becomes OV this makes N70 OFF and the voltage at NET24 again reaches to VDDH-VT(P98). As N72 is OFF and P99 is weakly ON, NET25 is pulled to VDDH. There is no direct path between VDDH and GND therefore no power dissipation under stable condition IN=1.0V, OUT=3.6V.

Considering now the transition at IN from 1.0V to 0V. N71 is turned OFF and this does not affect the voltage at NET24 since N70 is already OFF. With voltage transition at IN, N72 is turned ON and P99 starts conducting weakly. Hence, NET25 is pulled down and as the voltage at NET25 crosses the threshold of HV1, the voltage at Z becomes 3.3V making OUT 0V. As Z becomes 3.3V N70 is turned ON but no current flows through it as N71 is OFF. There is a small amount of current flow through P99 as it is weakly ON. The proposed circuit works very well for translating low voltages to higher voltages under all operating conditions because there is no feedback operation during the transition. The proposed circuit also works well for configurable I/O blocks where VDDH changes depending upon the standard supported.

Figure 5:
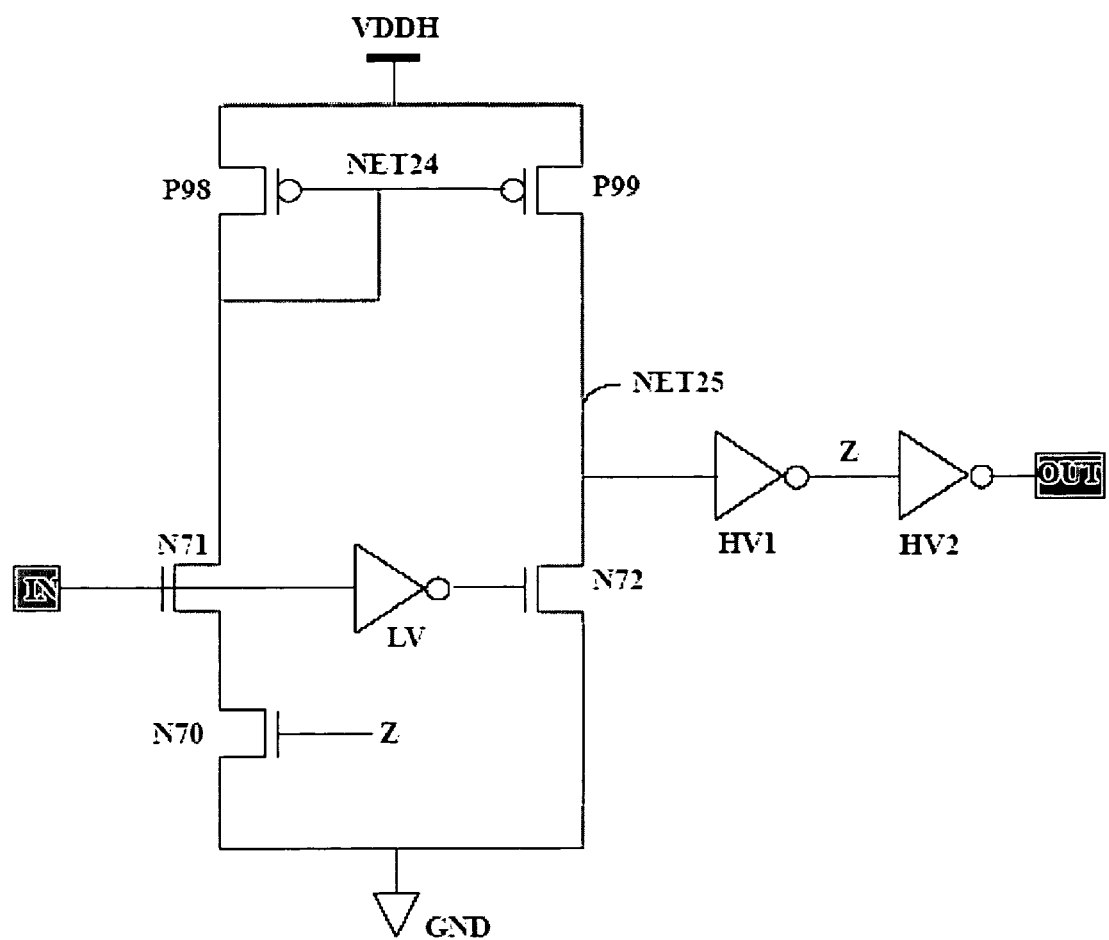
FIG. 5 is a schematic diagram of a voltage-level converter in accordance with another embodiment of the present invention.

FIG. 5 shows another embodiment of the invention where the position of the switch transistor N70 is changed. The drain of N70 is connected to the source of N71 while its source is grounded. The gate of N70 is connected to net Z. The operation of this circuit is the same as the operation of the circuit of FIG. 4.

Figure 6:
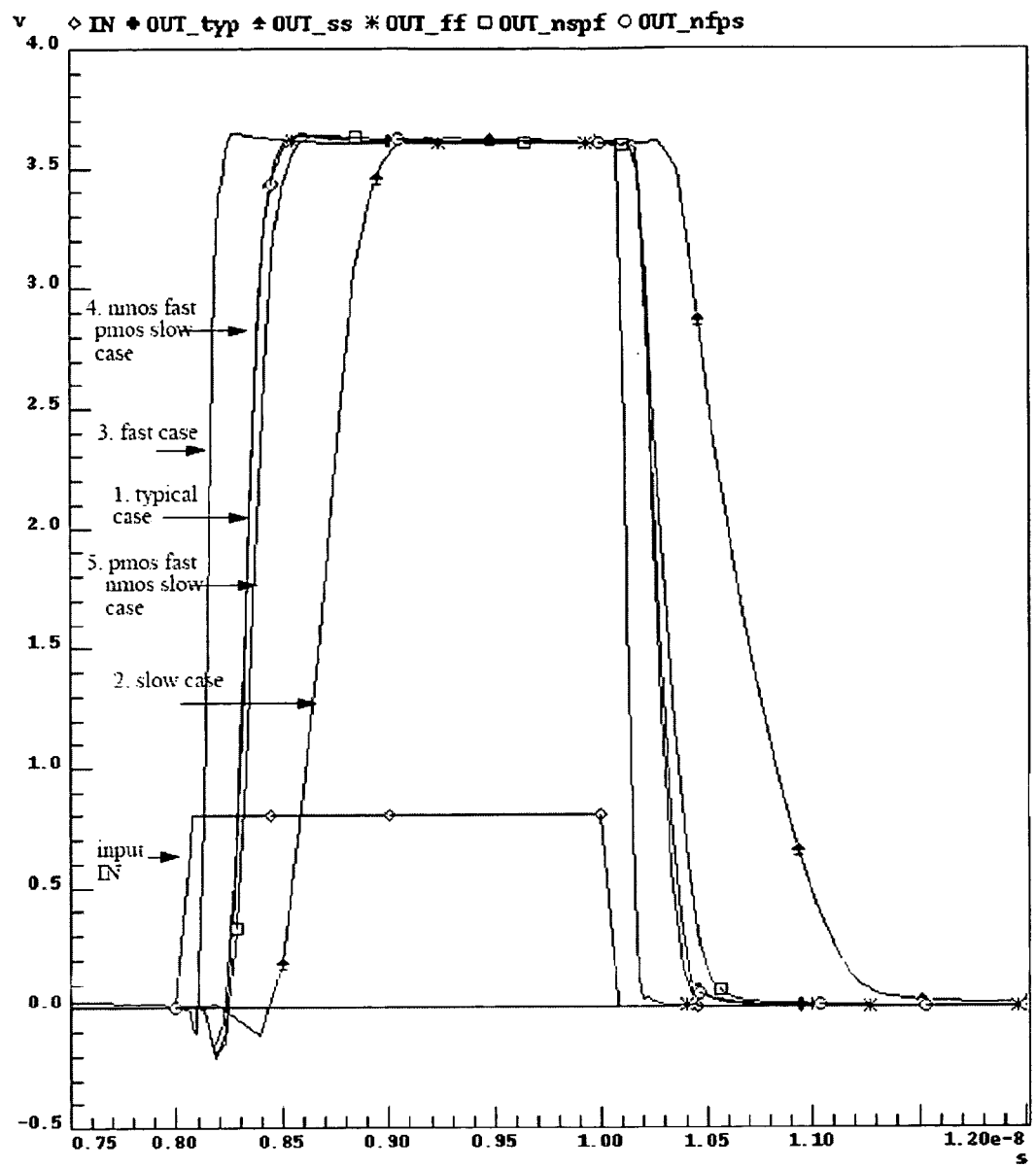
FIG. 6 is a plot of simulation results for an embodiment of the present invention in different operating conditions for a 0.8V to 3.6V translation.

FIG. 6 is a plot of simulation results for the circuit of FIG. 4. The various output waveforms shown under different process corners give valid and acceptable output. Also the transition times and propagation delays, i.e., delays between the input and the output, are also improved as compared to the prior art.

Thus, an embodiment of the present invention provides a CMOS voltage translator that can translate a lower core voltage, say 0.8V, to a higher IO voltage, say 3.6V, with reduced static power dissipation and reduced hardware as compared to the prior art. This circuit also provides improved transition times and propagation delays.

Although an embodiment of the present invention is described in reference to FPGAs for translating low-to-high-voltage-swing signals where the voltage difference is large, it may apply to other applications in CMOS ICs where low-to-high voltage-level translation is required. Those of ordinary skill in the art will appreciate that various combinations and arrangements may be employed without departing from the scope of the invention.

Figure 7:
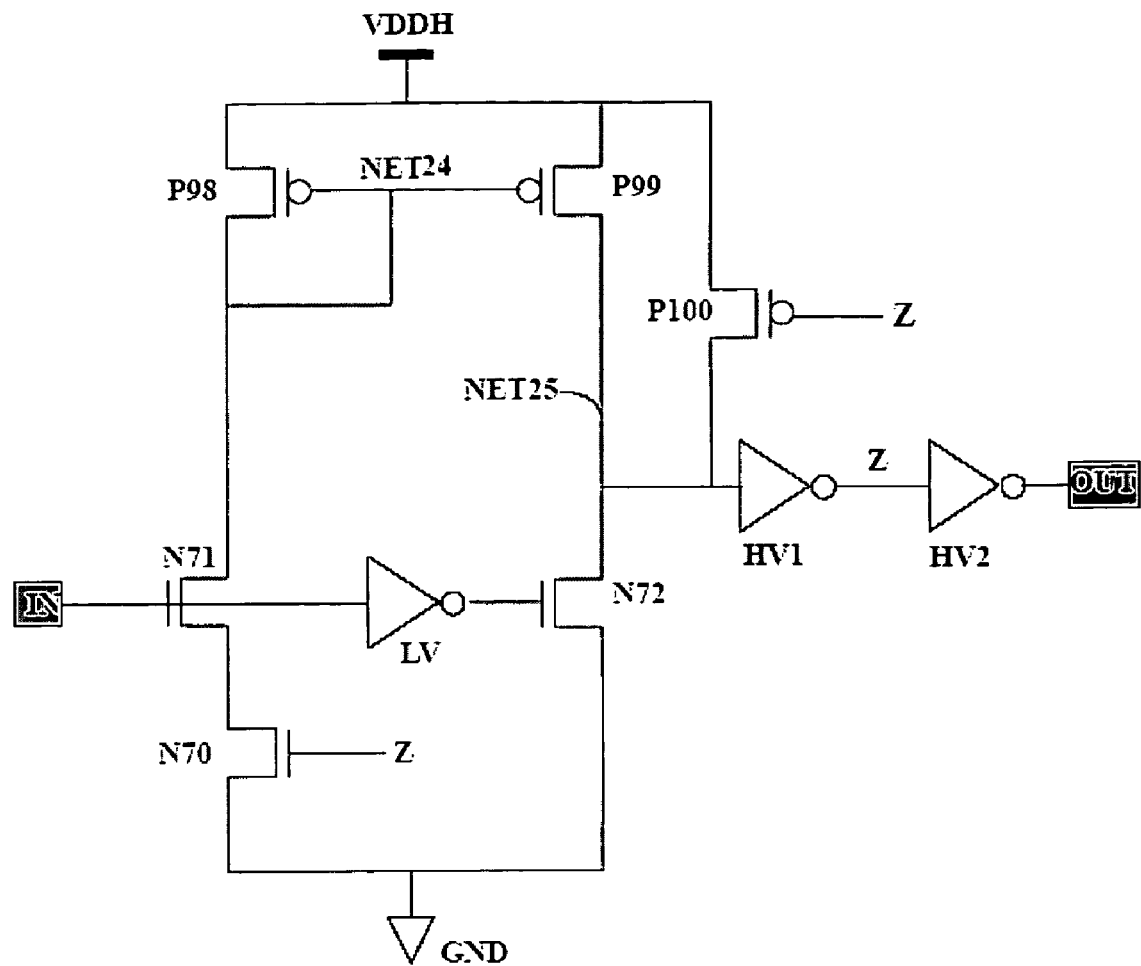
FIG. 7 is a schematic diagram of a voltage-level converter in accordance with yet another embodiment of the present invention.

FIG. 7 describes yet another embodiment of the present invention wherein a pmos P100 is added. P100 is connected between VDDH and NET25. The gate of P100 is connected to node Z. P100 is a very weak driver, and its purpose is to maintain the logic level at NET25. Consider a stable condition when IN is at logic 1. This makes NET25 VDDH while NET24 remains at VDDH-VT(P98). If there is no P100 and the voltage at IN remains at logic 1 for a long time, then there is possibility that NET24 reaches to VDDH. This will result in P99 being OFF. Hence, NET25 is left floating and a switching line (not shown in FIG. 7) in the vicinity of NET25 may generate noise on this line. If the noise is generated in such a direction that it decreases the voltage at NET25 to such an extant that HV1 toggles, this will make Z VDDH. As soon as the voltage at Z starts increasing, N70 is ON and again pulls down NET24, and the connect logic level is restored. During this logic restoration there is a possibility that a spike may be transmitted at the output. To reduce the possibility of this error, P100 may be connected between VDDH and NET25. Initially as IN switches from 0 to 1V, NET25 becomes logic 1 and voltage at Z becomes 0, and hence P100 is turned ON. Hence, while IN remains at logic 1, P100 drives NET25 and maintains the proper logic level 1 at OUT. The drive strength of P100, alongwith N72 and P99, decides the fall delay (OUT=1→OUT=0) of the circuit.

Figure 8:
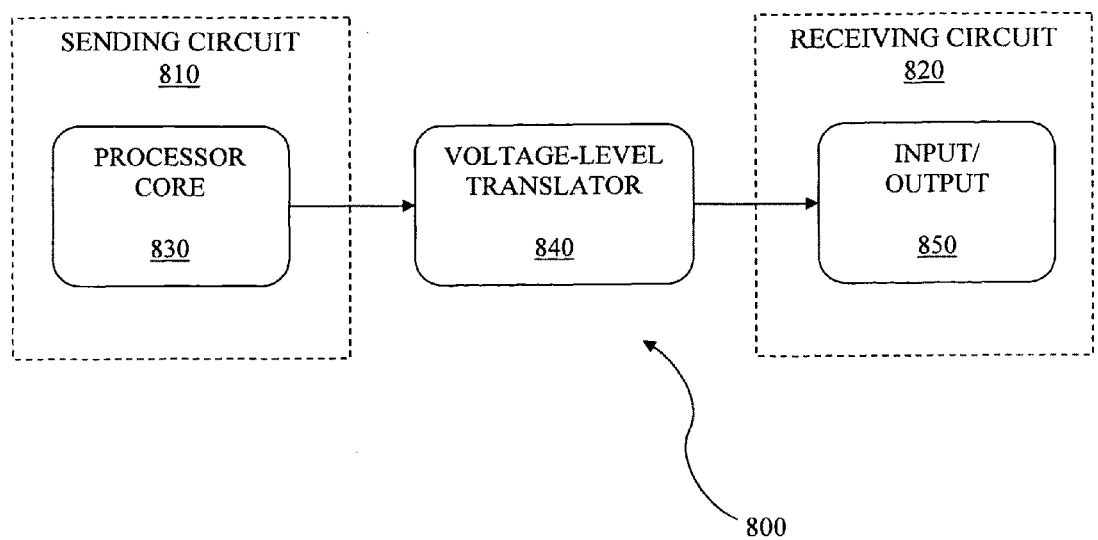
FIG. 8 is a block diagram of a system which includes a voltage-level converter in accordance with yet another embodiment of the present invention.
Figure 9:
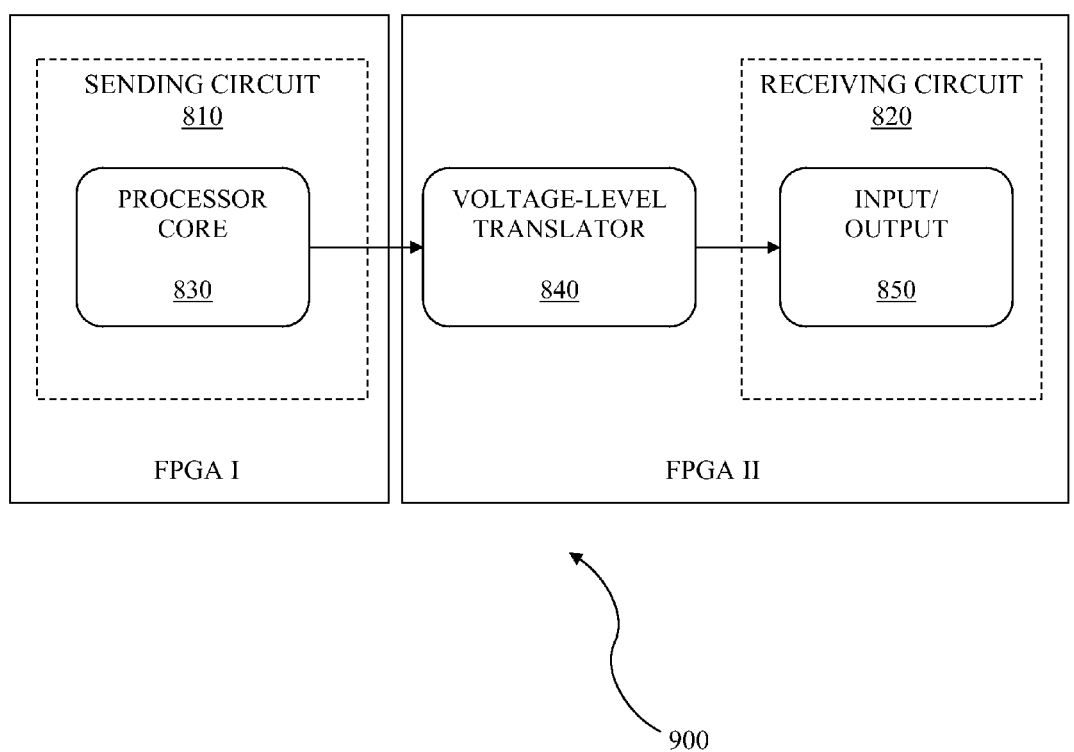
FIG. 9 is a block diagram of another system which includes a voltage-level converter in accordance with still another embodiment of the present invention.

One or more of the circuits of FIGS. 4, 5, and 7 may be incorporated in an integrated circuit (IC) such as an FPGA, and the IC may be incorporated into an electronic system such as a computer system. FIG. 8 shows a circuit 800 such as a processor having a sending circuit 810 that may comprise a processor core 830, a receiving circuit 820 that may comprise an input/output circuit 850, and a voltage-level converter 840 that may have the topology of an embodiment as shown in one of FIGS. 4, 5 and 7. FIG. shows a circuit 900 comprising two integrated circuits FPGA I and FPGA II. Integrated circuit FPGA I includes sending circuit 810, which further includes processor core 830, FPGA II includes the voltage-level translator 840 and a receiving circuit 820, which in turn comprises input/output circuit 850.

It is believed that embodiments of the present invention and many of their attendant advantages will be understood by the foregoing description. It is also believed that it will be apparent that various changes may be made in the form, construction and arrangement of the components thereof without departing from the scope and spirit of the invention or without sacrificing all of its material advantages.

What is claimed is:

1. A low-voltage to high-voltage level translator comprising:
a first switching element having its control input connected to receive an input signal and its input terminal coupled to receive a common terminal of a power supply,
a low-voltage inverting element having its input coupled to receive the input signal,
a second switching element having its control input coupled to the output of said low-voltage inverting element and its input terminal coupled to receive the common terminal of the power supply, a complementary switching element having its output coupled to the output of said second switching element and its input terminal coupled to receive a high-voltage power supply, a complementary biasing element having its input coupled to receive the high-voltage power supply and its output coupled to the control terminal of said complementary switching element, a first high-voltage inverting element having its input coupled to the output of said second switching element, a third switching element having its control terminal directly coupled to the output of said first high-voltage inverting element, its input coupled to the output of said first switching element and its output coupled to the output of said complementary biasing element, and a second high-voltage inverting element having its input coupled to the output of said first high-voltage inverting element and its output available as the final output, the output of said second high-voltage inverting element not coupled to the second switching element or to the complementary switching element.

2. The low-voltage to high-voltage level translator of claim 1, wherein a second complementary switching element is provided having its control terminal coupled to the output of said first high-voltage inverting element, its output coupled to the output of said second switching element and its input terminal coupled to receive the high-voltage power supply.

3. The low-voltage to high-voltage level translator of claim 1, wherein said first switching element is a N-type Field Effect Transistor (FET) device.

4. The low-voltage to high-voltage level translator of claim 1, wherein said second switching element is a N-type Field Effect Transistor (FET) device.

5. The low-voltage to high-voltage level translator of claim 1, wherein said third switching element is a N-type Field Effect Transistor (FET) device.

6. The low-voltage to high-voltage level translator of claim 1, wherein said complementary switching element is a P-type Field Effect Transistor (FET) device.

7. The low-voltage to high-voltage level translator of claim 2, wherein said second complementary switching element is a P-type Field Effect Transistor (FET) device.

8. The low-voltage to high-voltage level translator of claim 1, wherein said complementary biasing element is a P-type Field Effect Transistor (FET) device.

9. The low-voltage to high-voltage level translator of claim 2, wherein said FET devices are complementary metal oxide semiconductor (CMOS) devices.

10. A low-voltage to high-voltage level translator comprising:
a first switching element having its control input coupled to receive an input signal,
a low-voltage inverting element having its input coupled to receive the input signal,
a second switching element having its control input coupled to the output of said low-voltage inverting element and its input terminal coupled to receive a common terminal of a power supply,
a complementary switching element having its output coupled to the output of said second switching element and its input terminal coupled to receive a high-voltage power supply,
a complementary biasing element having its input coupled to the high-voltage power supply and its output coupled to the control terminal of said complementary switching element and the output of said first switching element,
a first high-voltage inverting element having its input coupled to the output of said second switching element,
a third switching element having its control terminal directly coupled to the output of said first high-voltage inverting element, its input coupled to receive the common terminal of the power supply and its output coupled to the input of said first switching element; and
a second high-voltage inverting element having its input coupled to the output of said first high-voltage inverting element and its output available as the final output, the output of said second high-voltage inverting element not coupled to the first high-voltage inverting element.

11. The low-voltage to high-voltage level translator of claim 10, wherein a second complementary switching element is provided having its control terminal coupled to the output of said first high-voltage inverting element, its output coupled to the output of said second switching element and its input terminal coupled to receive the high-voltage power supply.

12. The low-voltage to high-voltage level translator of claim 10, wherein said first switching element is a N-type Field Effect Transistor (FET) device.

13. The low-voltage to high-voltage level translator of claim 10, wherein said second switching element is a N-type Field Effect Transistor (FET) device.

14. The low-voltage to high-voltage level translator of claim 10 wherein said third switching element is a N-type Field Effect Transistor (FET) device.

15. The low-voltage to high-voltage level translator of claim 10, wherein said complementary switching element is a P-type Field Effect Transistor (FET) device.

16. The low-voltage to high-voltage level translator of claim 10, wherein said complementary biasing element is a P-type Field Effect Transistor (FET) device.

17. The low-voltage to high-voltage level translator of claim 11, wherein said second complementary switching element is a P-type Field Effect Transistor (FET) device.

18. The low-voltage to high-voltage level translator of claim 10, wherein said FET devices are complementary metal oxide semiconductor (CMOS) devices.

19. A voltage-level translator, comprising:
first and second supply nodes respectively operable to receive first and second supply voltages;
a translator input node operable to receive an input signal having one of a first and a second voltage level, the first voltage level having a magnitude that is less than the magnitude of the first supply voltage and that is greater than the magnitude of the second supply voltage;
a translator output node operable to carry an output signal that substantially equals the first supply voltage while the input signal has the first voltage level and that substantially equals the second supply voltage while the input signal has the second voltage level;
a first branch coupled between the first and second supply nodes and to the translator input node;
a second branch coupled between the first and second supply nodes, coupled directly to a control node of a transistor in the first branch, and coupled to the translator output node via an intermediate node that is different than the translator output node, the second branch operable to drive the intermediate node with a first drive strength for a predetermined time in response to a transition of the input signal from the second voltage level to the first voltage level, and to drive the intermediate node with a second drive strength that is different than the first drive strength after the elapse of the predetermined time; and a first inverter having an input node coupled to the intermediate node and having an output node;
a second inverter coupled between the first inverter and the translator output node.

20. The voltage-level translator of claim 19 wherein the first drive strength is stronger than the second drive strength.

21. The voltage-level translator of claim 19 wherein the second voltage level is substantially equal to the second supply voltage.

22. The voltage-level translator of claim 19 wherein:
the first voltage level and the first supply voltage are positive relative to the second supply voltage; and
the second voltage level and second supply voltage substantially equal ground voltage.

23. The voltage-level translator of claim 19 wherein the first branch comprises:
a first transistor having a first conduction node coupled to the first supply node, a second conduction node, and a control node coupled to the second conduction node,
a second transistor having a first conduction node coupled to the second conduction node of the first transistor, a second conduction node, and a control node coupled to the intermediate node of the second branch, and
a third transistor having a first conduction node coupled to the second conduction node of the second transistor, a second conduction node coupled to the second supply node, and a control node coupled to the translator input node.

24. The voltage-level translator of claim 19, further comprising:
wherein the first branch comprises
a PMOS transistor having a first conduction node coupled to the first supply node, a second conduction node, and a control node coupled to the second conduction node,
a first NMOS transistor having a first conduction node coupled to the second conduction node of the PMOS transistor, a second conduction node, and a control node coupled to output node of the first inverter, and
a second NMOS transistor having a first conduction node coupled to the second conduction node of the first NMOS transistor, a second conduction node coupled to the second supply node, and a control node coupled to the translator input node.

25. The voltage-level translator of claim 19 wherein the first branch comprises:
a first transistor having a first conduction node coupled to the first supply node, a second conduction node, and a control node coupled to the second conduction node,
a second transistor having a first conduction node coupled to the second conduction node of the first transistor, a second conduction node, and a control node coupled to the translator input node, and
a third transistor having a first conduction node coupled to the second conduction node of the second transistor, a second conduction node coupled to the second supply node, and a control node coupled to the intermediate node of the second branch.

26. The voltage-level translator of claim 19,
wherein the first branch comprises
a PMOS transistor having a first conduction node coupled to the first supply node, a second conduction node, and a control node coupled to the second conduction node,
a first NMOS transistor having a first conduction node coupled to the second conduction node of the PMOS transistor, a second conduction node, and a control node coupled to the translator input node, and
a second NMOS transistor having a first conduction node coupled to the second conduction node of the first NMOS transistor, a second conduction node coupled to the second supply node, and a control node coupled to the output node of the first inverter.

27. The voltage-level translator of claim 19,
wherein the second branch comprises
a first transistor having a first conduction node coupled to the first supply node, a second conduction node coupled to the translator output node, and a control node coupled to the first branch, and
a second transistor having a first conduction node coupled to the second conduction node of the first transistor, a second conduction node coupled to the second supply node, and a control node coupled to the output node of the inverter.

28. The voltage-level translator of claim 19,
wherein the second branch comprises
a first transistor having a first conduction node coupled to the first supply node, a second conduction node, and a control node coupled to the first branch, and
a second transistor having a first conduction node coupled to the second conduction node of the first transistor, a second conduction node coupled to the second supply node, and a control node coupled to the output node of the inverter; and
a buffer coupled between the second conduction node of the first transistor and the translator output node.

29. The voltage-level translator of claim 19,
wherein the second branch comprises
a PMOS transistor having a first conduction node coupled to the first supply node, a second conduction node coupled to the translator output node, and a control node coupled to the first branch, and
an NMOS transistor having a first conduction node coupled to the second conduction node of the PMOS transistor, a second conduction node coupled to the second supply node, and a control node coupled to the output node of the inverter.

30. The voltage-level translator of claim 19,
wherein the second branch comprises
a first transistor having a first conduction node coupled to the first supply node, a second conduction node, and a control node coupled to the first branch, and
a second transistor having a first conduction node coupled to the second conduction node of the first transistor, a second conduction node coupled to the second supply node, and a control node coupled to the output node of the inverter;
a buffer coupled between the second conduction node of the first transistor and the translator output node; and
a third transistor having a first conduction node coupled to the first supply node, a second conduction node coupled to the second conduction node of the first transistor, and a control node coupled to the buffer.

31. The voltage-level translator of claim 19,
wherein the second branch comprises
a first PMOS transistor having a first conduction node coupled to the first supply node, a second conduction node, and a control node coupled to the first branch, and
an NMOS transistor having a first conduction node coupled to the second conduction node of the PMOS transistor, a second conduction node coupled to the second supply node, and a control node coupled to the output node of the inverter;

a first inverter having an input node coupled to the second conduction node of the first PMOS transistor and having an output node;

a second PMOS transistor having a first conduction node coupled to the first supply node, a second conduction node coupled to the second conduction node of the first PMOS transistor; and a control node coupled to the output node of the first inverter.

32. An electronic system, comprising:

a sending circuit operable to generate a signal having one of a first and a second voltage level;

a receiving circuit having a receiving input node and having first and second supply nodes respectively operable to receive first and second supply voltages, the first supply voltage having a magnitude that is greater than the magnitudes of the second supply voltage and of the first and second voltage levels, the magnitude of the second supply voltage being less than the magnitude of the first voltage level; and a voltage-level translator including third and fourth supply nodes respectively operable to receive the first and second supply voltages, a translator input node operable to receive the signal from the sending circuit, a translator output node coupled to the receiving input node of the receiving circuit and operable to carry an output signal that substantially equals the first supply voltage while the signal has the first voltage level and that substantially equals the second supply voltage while the signal has the second voltage level, a first branch coupled between the third and fourth supply nodes and to the translator input node, and a second branch coupled between the third and fourth supply nodes, coupled directly to a control node of a transistor in the first branch, and coupled to the translator output node via an intermediate node, the second branch operable to drive the intermediate node with a first drive strength for a predetermined time in response to a transition of the signal from the second voltage level to the first voltage level, and to drive the intermediate node with a second drive strength that is different than the first drive strength after the elapse of the predetermined time; and a first inverter having an input node coupled to the intermediate node and having an output node;

a second inverter coupled between the first inverter and the translator output node.

33. The electronic system of claim 32 wherein the sending circuit, receiving circuit, and voltage-level translator are disposed on a same integrated-circuit die.

34. The electronic system of claim 32 wherein:

one of the sending circuit, receiving circuit, and voltage-level translator is disposed on a first integrated-circuit die; and another of the sending circuit, receiving circuit, and voltage-level translator is disposed on a second integrated-circuit die.

35. The electronic system of claim 32 wherein one of the sending and receiving circuits comprises a controller.

36. The electronic system of claim 32 wherein:

the sending circuit comprises a processor core; and the receiving circuit comprises an input-output circuit.

\* \* \* \* \*

UNITED STATES PATENT AND TRADEMARK OFFICE
CERTIFICATE OF CORRECTION

| | | |
|---|---|---|
| PATENT NO. | : 7,999,573 B2 | Page 1 of 1 |
| APPLICATION NO. | : 11/649746 | |
| DATED | : August 16, 2011 | |
| INVENTOR(S) | : Rajesh Narwal et al. | |

It is certified that error appears in the above-identified patent and that said Letters Patent is hereby corrected as shown below:

- In Column 6, Line 42 of the patent, please add "9" after "FIG."

Signed and Sealed this

Thirteenth Day of November, 2012

David J. Kappos
*Director of the United States Patent and Trademark Office*